United States Patent
Joos et al.

(10) Patent No.: US 8,280,338 B2
(45) Date of Patent: Oct. 2, 2012

(54) MIXER CELL WITH A DYNAMIC BLEED CIRCUIT

(75) Inventors: Dieter Joos, Mechelen (BE); Steven Terryn, Denderleeuw (DE)

(73) Assignee: ST-Ericsson SA, Geneva (CH)

( * ) Notice: Subject to any disclaimer, the term of this patent is extended or adjusted under 35 U.S.C. 154(b) by 478 days.

(21) Appl. No.: 12/509,327

(22) Filed: Jul. 24, 2009

(65) Prior Publication Data
US 2010/0029234 A1    Feb. 4, 2010

(30) Foreign Application Priority Data
Jul. 25, 2008 (EP) ..................................... 08161226

(51) Int. Cl.
*H04B 1/26* (2006.01)
(52) U.S. Cl. .................... 455/323; 455/326; 455/333
(58) Field of Classification Search .................. 455/323, 455/326, 333
See application file for complete search history.

(56) References Cited

U.S. PATENT DOCUMENTS
| 7,046,068 | B2 | 5/2006 | Chiu et al. | |
| 7,161,406 | B1 | 1/2007 | Ferris | |
| 2004/0038662 | A1 | 2/2004 | Darabl | |
| 2007/0126491 | A1 | 6/2007 | Woo et al. | |
| 2007/0142018 | A1* | 6/2007 | Lin et al. | 455/326 |
| 2008/0014896 | A1* | 1/2008 | Zhuo et al. | 455/326 |
| 2008/0051055 | A1 | 2/2008 | Hwang et al. | |
| 2010/0105350 | A1* | 4/2010 | Baltus | 455/326 |

FOREIGN PATENT DOCUMENTS
GB   2 433 366 A   6/2007

OTHER PUBLICATIONS

European Search Report dated Dec. 1, 2008 in connection with European Patent Application No. EP 08 16 1226.

* cited by examiner

*Primary Examiner* — Duc M Nguyen
(74) *Attorney, Agent, or Firm* — Coats & Bennet, P.L.L.C.

(57) ABSTRACT

A mixer is described having a Gilbert cell structure including a first input and a second input for inputting an RF signal, a third input and a fourth input for inputting a local oscillator signal, a first output and a second output for outputting an IF signal, a plurality of switches for converting the RF signal to an IF signal, and a dynamic bleed circuit for dynamically reducing the dc-current of the switches at the switching-point. As the dc-current of the switches is reduced at the point of commutation, the 1/f-noise is also strongly reduced without degrading the linearity. The switching happens at twice the local oscillator frequency. The mixer also includes a common mode feedback circuit that feeds the common mode signal, optionally amplified, to a common mode feedback control device that is in series between the dynamic bleed circuit and the supply voltage.

20 Claims, 3 Drawing Sheets

MIXER CELL WITH A DYNAMIC BLEED CIRCUIT

CROSS-REFERENCE TO RELATED APPLICATION(S) AND CLAIM OF PRIORITY

The present application is related to and claims priority under 35 U.S.C. §119(a) to a European patent application filed in the European Patent Office on Jul. 25, 2008 and assigned Serial No. 08161226.9, the contents of which are incorporated herein by reference.

TECHNICAL FIELD

The present invention generally relates to a mixer of a communication device and, in particular, to a mixer for use in a receiver as well as to a method of operating and making such a mixer and such a receiver.

BACKGROUND

Generally, a mixer or a mixer circuit refers to a circuit for converting an input signal of one frequency band into a signal of a second desired frequency band. The mixer is widely used in a transmitter and a receiver of a communication system and other various fields.

For example, an RF mixer is an essential part of wireless communication systems. Modern wireless communication systems demand stringent dynamic range requirements. The dynamic range of a receiver is often limited by the first downconversion mixer. This forces many compromises between figures of merit such as conversion gain, linearity, dynamic, range, noise figure and port to port isolation of the mixer. Integrated mixers become more desirable than discrete ones for higher system integration with cost and space savings. In order to optimize the overall system performance, there exists a need to design improved mixers for integrated solutions.

Mixers perform frequency translation by multiplying two signals (and possibly their harmonics). Downconversion mixers employed in the receive path have two distinctly different inputs called the RF input and the LO (local oscillator) input. The RF input receives the signal to be downconverted, and the LO input receives the periodic waveform generated by the local oscillator. The performance parameters of down-conversion mixers are the noise figure, the conversion gain, the input impedance, the 3rd order intercept point and the port-to-port isolation.

An example of a mixer is a mixer for use in a direct conversion receiver of a mobile communication system. The mixer mixes an input Radio Frequency (RF) signal with a signal from a Local Oscillator (LO) to output an Intermediate Frequency (IF) signal. The mixer is generally implemented with a Complementary Metal-Oxide Semiconductor (CMOS). The Receive Mixer down converts the high frequency of the signal received over the air to a lower frequency. The Noise Figure (NF) of this circuit is an important parameter and needs to be small. Next to the NF, the linearity is an important parameter. These two constraints require a considerable amount of power.

Passive mixers are often used in order to go to very small noise figures. In a passive mixer, there is no or little 1/f-noise. The passive mixer uses no dc-current through the switches but is very power hungry to make the interfacing with the preceding and following stage. In this sense, the passive mixer was not a good solution for a low power receiver such as a Bluetooth™ receiver.

As shown schematically in FIG. 1a, a double balanced active mixer comprises switches driven by a local oscillator (LO) that reverses the polarity of an RF input at the LO frequency. To get the highest performance from the mixer, the RF to IF path should be as linear as possible, and the switching time of the LO switch should be a minimum. The mixer performs frequency translations (conversion) by multiplication of an RF input signal with an LO signal. The balanced structure of FIG. 1a cancels any output at the RF input frequency since it will average to zero. It also cancels out any LO frequency component since the IF output is a differential signal and the LO appears as common mode. Such a mixer in reality has a noise problem (e.g., at the low end of the dynamic range) or intermodulation distortion (IMD) problem at the high end since the transconductors and loads such as resistors are non-linear and the switches are not ideal.

One form of double balanced active mixer is a Gilbert cell mixer. A disadvantage of the structure is the 1/f-noise produced by the switches which is determined by the amount of dc-current through the switches. The active Gilbert type cell mixer can be used in transconductance mode (current output); therefore, it is necessary to have a high output impedance.

The noise figure (NF) and the linearity behave inversely proportional to the dc-current through the switches. The higher the dc-current the better the linearity but the worse 1/f-noise. It is difficult or impossible to find a good trade-off. To improve the NF, the switch needs to be very fast and require a low threshold (i.e., a low Vgs-Vt), but this reduces the output impedance and degrades the overall receiver performance in terms of bandwidth, gain and linearity.

FIG. 1b is a circuit diagram of a known mixer according to US 2007/0126491. Referring to FIG. 1b, the known mixer includes Field Effect Transistors (FETs) M1-M6, a current bias source IBIAS, two load impedances RLOAD1, RLOAD2, and other FETs M7 and M8. The FETs M7 and M8 constitute a static current bleeding circuitry, and the other components constitute a so-called Gilbert cell mixer.

This mixer may be, for example, the mixer for a receiver (e.g., a mixer for use in downconverting from an RF frequency to an intermediate frequency IF). In this case, the gates of transistors M3 and M6 of the mixer are connected to outputs of an RF front end of a receiver (i.e., are coupled to the outputs RF+ and RF− of a linear amplifier that amplifies a received signal). The IF outputs IF+ and IF− of the mixer can be connected to the inputs of an IF unit. Oscillating signal outputs LO+ and LO+ of a local oscillator LO are connected to the gates of transistors M1 and M5, and M2 and M4, respectively. Thus, the mixer receives an RF signal as an input, mixes the input RF signal with a signal oscillated by the LO, and outputs a resulting IF signal.

A gate of FET M1 is connected to a first output LO+ of the LO, a drain is connected to a side of the first load RLOAD1 and a first input IF+ of an IF unit, and a source is connected to a source of the FET M2 and a drain of the FET M3. A gate of FET M2 is connected to a second output LO− of the LO and a gate of the FET M4, a drain is connected to a side of the second load RLOAD2 and a second input IF− of the IF unit, and a source is connected to the source of the FET M1 and the drain of the FET M3. A gate of FET M3 is connected to a first output RF+ of an RF unit, a drain is connected to the source of the FET M1 and the source of the FET M2, and a source is connected to a side of the current source IBIAS and a source of FET M6. The other side of the current source IBias is connected to ground.

A gate of FET M4 is connected to the second output LO− of the LO and the gate of the FET M2, a drain is connected to a side of the first load RLOAD1 and the first input IF+ of the IF unit, and a source is connected to a source of the FET M5 and a drain of the FET M6. A gate of FET M5 is connected to the first output LO+ of the LO, a drain is connected to a side of the second load RLOAD2 and the second input IF− of the IF unit, and a source is connected to a source of the FET M4 and a drain of the FET M6. A gate of FET M6 is connected to the second output RF− of the RF unit, a drain is connected to the source of the FET M4 and a source of the FET M5, and a source is connected to a side of the current source IBIAS and the source of FET M3. FETs M1-M6 may be implemented as P-type Metal-Oxide-Semiconductor Field-Effect Transistors (MOSFETs).

One side of the first load RLOAD1 is connected to the first input IF+ of the IF unit and the drain of the FET M1, and the other side is connected to a supply voltage terminal VDD. One side of second load RLOAD2 is connected to the second input IF− of the IF unit and the drain of the FET M5, and the other side is connected to the supply voltage terminal VDD.

A gate of FET M7 is connected to a voltage source VBias, a source (or drain) is connected to the supply voltage terminal VDD, and a drain (or source) is connected to the sources of the FETs M1 and M2 and the drain of the FET M3. A gate of FET M8, is connected to another voltage source VBias, a source (or drain) is connected to the supply voltage VDD, and a drain (or source) is connected to the sources of the FETs M4 and M5 and the drain of the FET M6.

For the known mixer as shown in FIG. 1b, it is claimed that the flicker noise, also referred to as 1/f noise, can be effectively removed by the current bleeding circuitry formed by the FETs M7 and M8. In the mixer, flicker noise originates from the FETs M1 and M5. In other words, if a large amount of current flows through the sources of FETs M1 and M5, more flicker noise is generated. Thus, there is a need to ensure that only a small amount of current flows through the sources of the FETs M1 and M5. For a good conversion performance of the mixer, there is a need to ensure that a large amount of current flows through the FETs M3 and M6 (i.e., the FETs M3 and M6 from the sources of the FETs M1 and M5).

By using a current bleeding circuitry, the achievement of the conflicting requirements can be improved. The flicker requirement can be improved by ensuring that a small amount of current flows through the sources of the FETs M1 and M5, and the conversion requirement can be improved by ensuring that a large amount of current flows through the current bleeding circuitry (i.e., the FETs M7 and M8 in order to ensure that a large amount of current flows through the FETs M3 and M6). In practice, the conversion requirements and the noise requirements are not compatible.

SUMMARY

It is, therefore, an aspect of the present invention to provide a good mixer having switches and a method of operating and making the same. In accordance with an aspect of the present invention the 1/f-noise in the switches in the mixer is highly reduced which makes it possible to find a good trade-off between linearity, NF and output impedance.

According to one aspect of the present invention, there is provided a mixer having a Gilbert cell structure including a first input and a second input for inputting an RF signal, a third input and a fourth input for inputting a local oscillator signal, a first output and a second output for outputting an IF signal, switches to convert the RF input to the IF output, and a dynamic bleed circuit for dynamically reducing the dc-current of the switches at the switching-point. As the dc-current of the switches is reduced, the 1/f-noise is also strongly reduced. The switching happens at twice the local oscillator frequency.

A first load is connected between a supply voltage and the first output, and a second load is connected between the supply voltage and the second output. The mixer also includes a common mode feedback circuit that feeds the common mode signal, optionally amplified to a common mode feedback control device that is in series between the dynamic bleed circuit and the supply voltage.

In detail, the mixer further includes a first transistor having a drain connected to the first output, a gate connected to the third input, and a source, a second transistor having a drain connected to the second output, a gate connected to the fourth input, and a source, a third transistor having a drain connected to the sources of the first transistor and the second transistor, a gate connected to the first input, and a source coupled to ground (e.g., via a current source), a fourth transistor having a drain connected to the first output, a gate connected to the fourth input, and a source, a fifth transistor having a drain connected to the second output, a gate connected to the third input, and a source, a sixth transistor having a drain connected to the sources of the fourth transistor and the fifth transistor, a gate connected to the second input, and a source coupled to ground (e.g., via the current source), a seventh transistor having a source (or drain) coupled to a supply voltage (e.g., via a common mode feedback control element), a gate connected to a voltage source, and a drain (or source) connected to the drain of the third transistor, and a eighth transistor having a source (or drain) coupled to a supply voltage (e.g., via a common mode feedback control element), a gate connected to a voltage source, and a drain (or source) connected to the drain of the sixth transistor. The gate of the seventh transistor is coupled to the drain (or source) of the eighth transistor via a dc-decoupling element such as a capacitor or a capacitor circuit, and the gate of the eighth transistor is coupled to the drain (or source) of the seventh transistor via a dc-decoupling element such as a capacitor or a capacitor circuit.

Two inductors may be optionally inserted between the power supply (VDD), ground or VB2, and the drains of the third transistor and the sixth transistor. The first inductor is optionally connected between the power supply (VDD), ground or VB2, and the drain of the third transistor and the second inductor is optionally connected between the power supply (VDD), ground or VB2, and the drain of the sixth transistor, respectively.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION

Figure 1A:
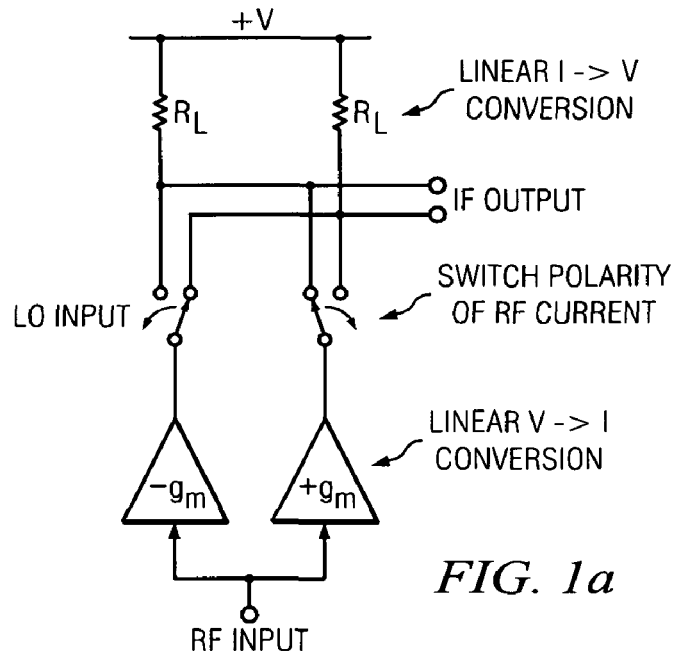
FIGS. 1a and 1b show circuit diagrams of known mixers.

Preferred embodiments of the present invention will now be described in detail with reference to the annexed drawings.

In the following description, a detailed description of known functions and configurations incorporated herein has been omitted for conciseness.

Although, the present invention will be described with respect to particular embodiments and with reference to certain drawings, the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. Similarly, it is to be noticed that the term "connected", also used in the claims, should not be interpreted as being restricted to direct connections only, although "connected" includes a direct connection which may be advantageous. The term "coupling" should also be interpreted as not being limited to direct connections. Reference throughout this specification to "one embodiment" or "an embodiment" means that a particular feature, structure or characteristic described in connection with the embodiment is included in at least one embodiment of the present invention. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. Furthermore, while some embodiments described herein include some but not other features included in other embodiments, combinations of features of different embodiments are meant to be within the scope of the invention, and form different embodiments, as would be understood by those in the art. In the description provided herein, numerous specific details are set forth. However, it is understood that embodiments of the invention may be practised without these specific details. In other instances, well-known methods, structures and techniques have not been shown in detail in order not to obscure an understanding of this description.

Figure 2A:
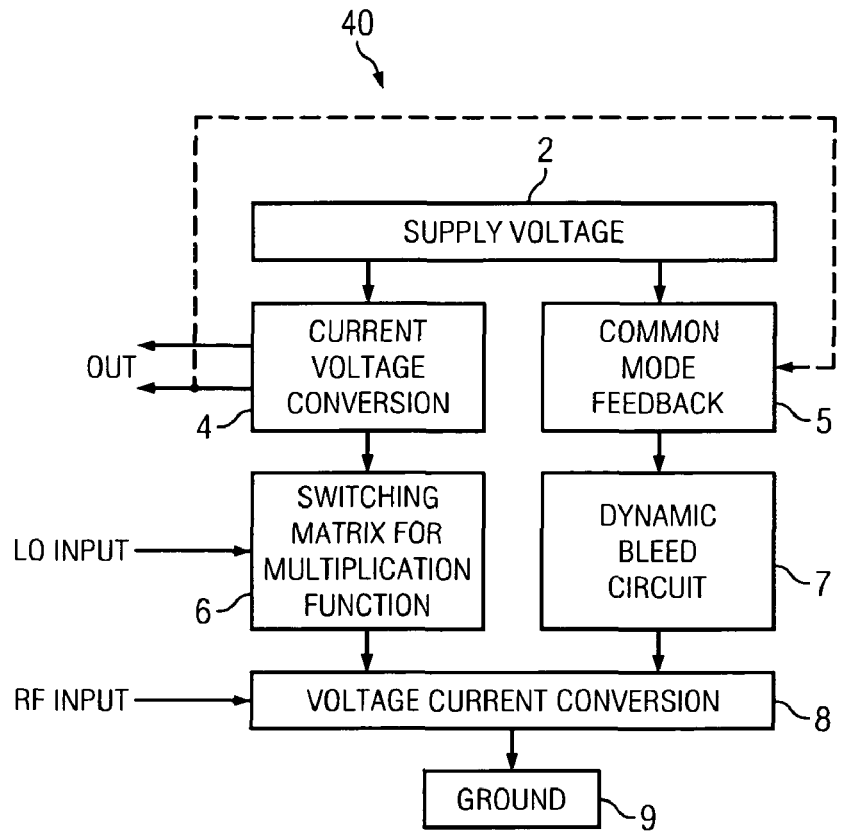
FIGS. 2a and 2b are circuit diagrams of mixers according to embodiments of the present invention.

FIG. 2a shows a double balanced mixer such as a Gilbert cell mixer 40 according to an embodiment of the present invention. The major units of the mixer 40 are:
a) A voltage current conversion unit 8 which receives the RF input and is coupled to ground.
b) A supply voltage unit 2.
c) A common mode feedback unit 5 and a dynamic bleed circuit 7 arranged in series between the supply voltage unit 2 and the voltage current conversion unit 8.
d) A current voltage conversion unit 4 and a switching matrix 6 for carrying out a multiplication function arranged in series between the supply voltage unit 2 and the voltage current conversion unit 8. The local oscillator input signal is multiplied with the output of the voltage current conversion unit 8. The output of the mixer is supplied from the current conversion voltage unit 4.
e) The common mode feedback unit 5 and the dynamic bleed circuit 7 are arranged in parallel with the current voltage conversion unit 4 and a switching matrix 6.

The mixer can be implemented as a CMOS mixer. Main concerns in designing CMOS mixers are to improve conversion gain and linearity and reduce flicker noise. Flicker noise is inversely proportional to a frequency and typically occurs at a frequency less than several MHz in CMOS process. Flicker noise is also referred to as "1/f noise".

Figure 2B:
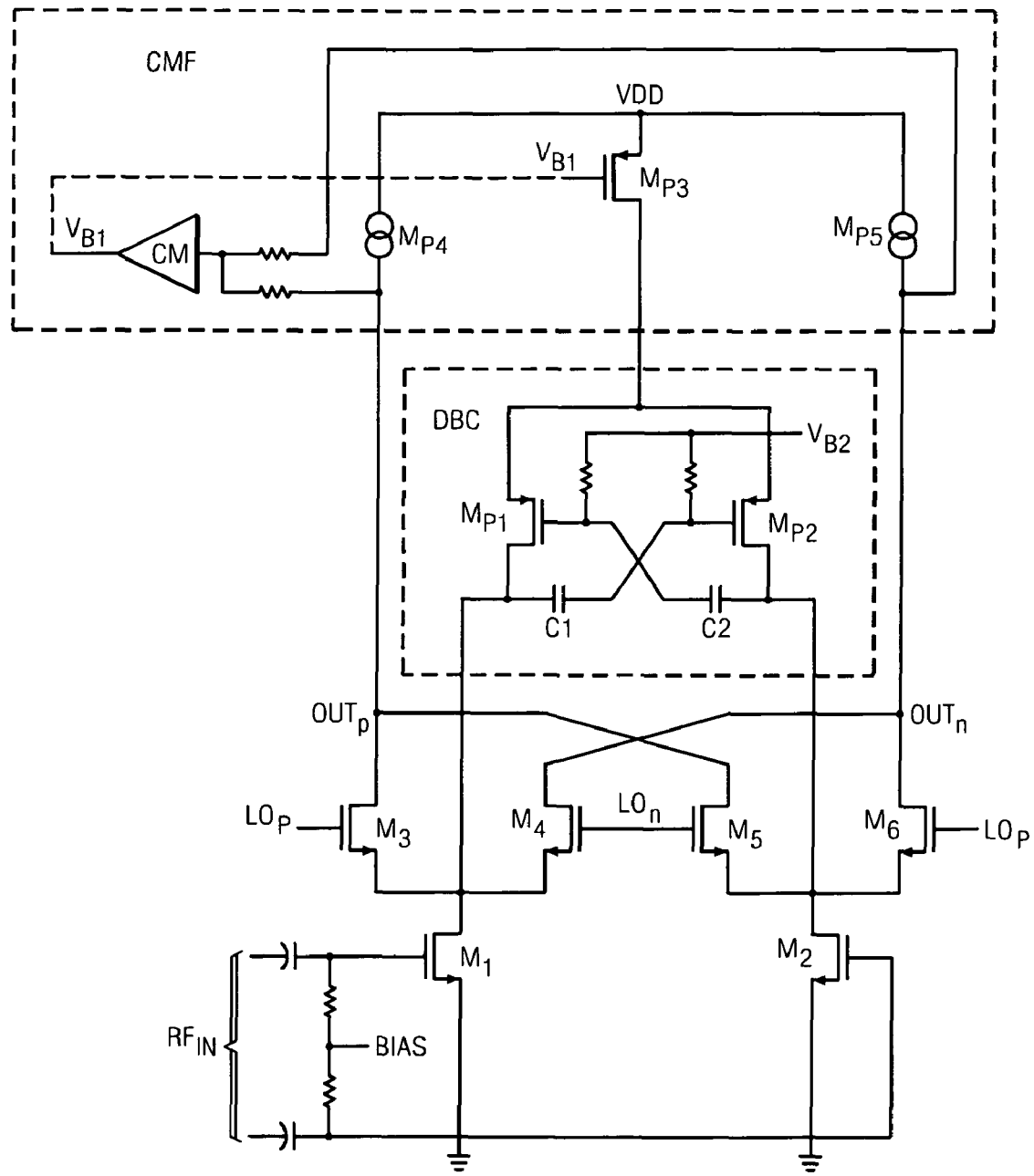

FIG. 2b shows a specific embodiment of a mixer 40 according to the present invention. It includes voltage to current converter elements such as Field Effect Transistors (FETs) M1-M2. Any other suitable elements could be used to replace any or all of the FET's M1-M2. Mixer 40 also includes switching elements such as Field Effect Transistors (FETs) M3-M6 and MP1-2. The switching elements are preferably FETs as these transistors have a fast enough switching capability and a low power consumption. Any other fast switching elements could be used to replace any or all of the FET's M3-M6 and MP1-2 including transistors or active circuits such as transistors circuits. The circuit also includes a control device as part of a common mode feedback circuit CMF. The control device may be a transistor MP3, a transistor circuit or any other control element that operates in an analogous manner. An optional current bias source can be connected to the sources of transistors M1 and M2. The FETs MP1 and MP2 constitute a dynamic current bleeding circuitry DCB.

An RF signal is applied to the gates of transistors M1 and M2 which perform a voltage to current conversion. For correct operation, these devices should not be driven into saturation, and therefore, signals considerably less than the 1 dB compression point should be used. Performance can be improved by adding degeneration resistors on the source terminals of M1 and M2. Transistors M3 to M6 form a multiplication function, multiplying the linear RF signal current from M1 and M2 with the LO signal applied across the gates of M3 to M6, which provide the switching function. M1 and M2 provide positive or negative RF current, and M3 and M5 switch between them to provide the RF signal or the inverted RF signal to a left hand load. M4 and M6 switch between them to provide the RF signal or the inverted RF signal to the right hand load. The two loads form a current to voltage transformation giving differential output IF signals OUT.

The FETs M1-M6 and MP1-3 can be used as 4 terminal devices: drain, source, gate and bulk where a signal is input through the gate, while the bulk is used to isolate the FET from other devices on the same substrate.

This mixer 40 may be, for example, the mixer for a receiver (e.g., a mixer for use in downconverting from an RF frequency to an intermediate frequency IF). In this case, the gates of transistors M1 and M2 of the mixer 40 are RF inputs $RF_{IN}$ connected to outputs of an RF front end of a receiver (e.g., are coupled to the outputs of a linear amplifier that amplifies a received RF signal). The IF outputs $OUT_P$ and $OUT_N$ of the mixer 40 can be connected to the inputs of an IF unit. Oscillating signal outputs $LO_P$ and $LO_N$ of a local oscillator LO are connected to the gates of transistors M3 and M4, and M5 and M6, respectively. Thus, the mixer 40 receives an RF signal as an input, mixes the input RF signal with a signal oscillated by the LO, and outputs a resulting IF signal.

Figure 1B:
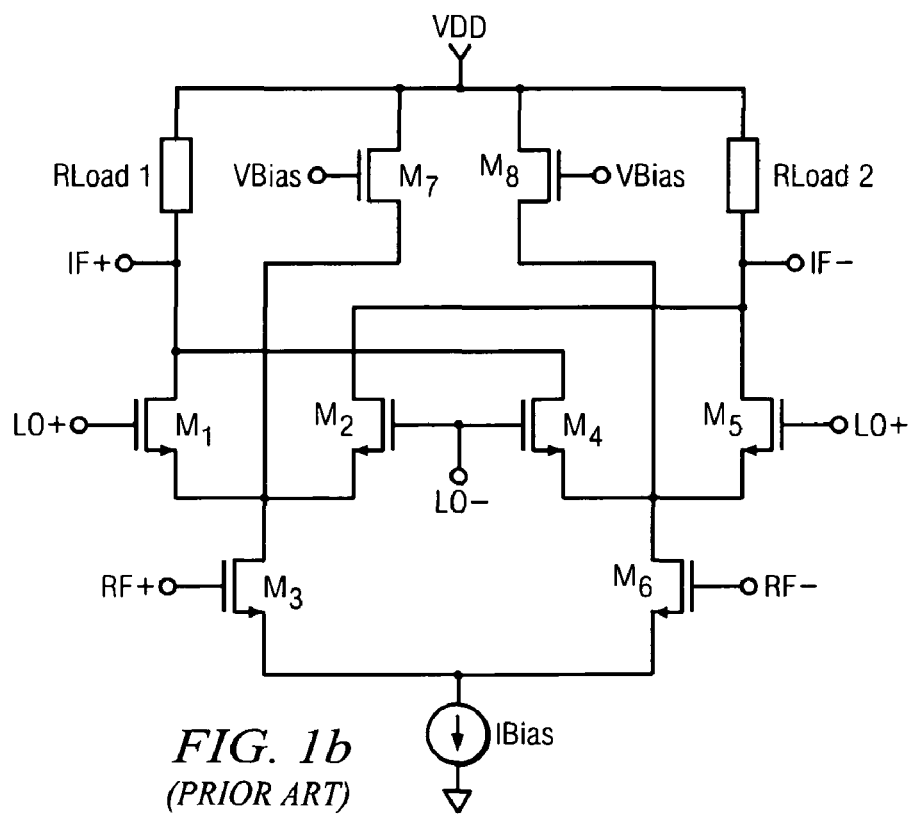

A gate of FET M3 is connected to a first output $LO_P$ of the LO, a drain is connected to a side of a load such as a current source $M_{P4}$ and to a first IF output $OUT_P$ of the mixer 40 for supply to an IF unit, and a source is connected to a source of the FET M4 and a drain of the FET M1. A gate of FET M4 is connected to a second output $LO_N$ of the LO and a gate of the FET M5, a drain is connected to a side of a load such as a current source $M_{P5}$ and a second IF output $OUT_N$ for supply to the IF unit, and a source is connected to the source of the FET M3 and the drain of the FET M1. A gate of FET M1 is connected to a first RFIN of an RF unit, a drain is connected to the source of the FET M3 and the source of the FET M4, and a source is connected to ground (or optionally a side of a current source) and a source of FET M2. If a bias current source is used (see FIG. 1), the other side of the current source is connected to ground.

A gate of FET M5 is connected to the second output LON of the LO and the gate of the FET M4, a drain is connected to the load (e.g., current source $M_{P4}$) and the first IF output $OUT_P$ for supply to the IF unit, and a source is connected to a source of the FET M6 and a drain of the FET M2. A gate of FET M6 is connected to the first output $LO_P$ of the LO, a drain is connected to a side of the load (e.g., current source $M_{P5}$) and the second IF output $OUT_N$ of the mixer 40 for supply to the IF unit, and a source is connected to a source of the FET M5 and a drain of the FET M2. A gate of FET M2 is connected to the second $RF_{IN}$ of the RF front end, a drain is connected to the source of the FET M5 and a source of the FET M6, and a source is connected to ground (or optionally to a side of a current source) and the source of FET M1. FETs M1-M6 may be implemented as N-Type or as P-type MOS FETs.

One side of the load (e.g., current source $M_{P4}$) is connected to the first IF output $OUT_P$ of the mixer 40 for supply to an IF unit, and the drain of the FET M3 and the other side is connected to a supply voltage terminal VDD. One side of the load (e.g., current source $M_{P5}$) is connected to the second IF output $OUT_P$ of the mixer 40 for supply to an IF unit, and the drain of the FET M6 and the other side is connected to the supply voltage terminal VDD.

A gate of FET MP1 is connected to a voltage bias source VB2 as well as to the drain of FET MP2 via a dc-decoupling element such as a capacitor C2 or a capacitor circuit or any other high pass electronic element that acts as a dc-decoupling element, a source (or drain) is connected to the supply voltage terminal VDD through a transistor MP3, and a drain (or source) is connected to the sources of the FETs M3 and M4 and the drain of the FET M1. A gate of FET MP2 is connected to the voltage bias source VB2 as well as to the drain of FET MP1 via a dc-decoupling element such as a capacitor C1 or a capacitor circuit or any other high pass electronic element that acts as a dc-decoupling element, a source (or drain) is connected to the supply voltage VDD through the transistor MP3, and a drain (or source) is connected to the sources of the FETs M5 and M6 and the drain of the FET M2. The FETs MP1 and MP2 constitute a dynamic current bleeding circuitry DCB that dynamically reduces the dc current at the switching-point. FETs MP1-3 may be implemented as P-Type or as N-type MOS FETs.

In operation, the positive phase of the local oscillator, $LO_P$, has an amplitude sufficiently larger than the threshold voltage of M3 and M6 to switch them ON (in the saturation region). At the same time, $LO_N$ is less than the threshold voltage of M2 and M3 to switch them OFF (in cut-off). The RF input can now pass to the IF output via the back gate transconductance (gmbs) of M3 and M6. In the negative phase of the local oscillator, M4 and M5 are ON while M3 and M6 are OFF. The RF input is now inverted when it appears at the IF output. Thus the RF input is commutated by the action of the local oscillator on the gates of M3-6, and hence converted to the desired IF frequency. In embodiments of the present invention, as the dc-current is dynamically reduced at the switching-point, the 1/f-noise is also strongly reduced. The switching happens at twice the local oscillator frequency. This signal (2×LO) is obtained at the source of the differential switching pairs (M3-M4 and M5-M6, respectively). This signal at the source of one of the differential pairs (M3-M4) is connected to the gate of the PMOS transistor MP2. The drain of this PMOS transistor MP2 is connected to the second differential switching pair source (M5-M6). The second differential pair source (M5-M6) is connected to a second PMOS transistor MP1, whose drain is connected to the first differential pair source (M3-M4). There is a cross-coupling using 2×LO negative feedback by the PMOS transistors. To be able to bias the negative feedback PMOS structure (MP1,MP2) in the most optimal way, dc-decoupling elements such as capacitors C1 and C2 are provided inside the connection path. Bias voltage VB2 is applied via resistors to optimally set the DC-biasing of the PMOS transistors MP1 and MP2.

Two inductors may be optionally inserted between the power supply (VDD), ground or VB2, and the drains of the third transistor and the sixth transistor. The first inductor is optionally connected between the power supply (VDD), ground or VB2, and the drain of the third transistor and the second inductor is optionally connected between the power supply (VDD), ground or VB2, and the drain of the sixth transistor, respectively.

The present invention has at least two advantages: Improved switching behavior increases the transconductance-GAIN and decreases the NF without decreasing the linearity.

The present invention also includes a common mode feedback circuit CMF. Any suitable CMF can be used. In a particular embodiment, the common mode voltage at the IF outputs ($OUT_P$ and $OUT_N$) can be controlled by the PMOS transistor MP3. The common mode IF output is fed to an amplifier CM whose output voltage VB1 is fed to the gate of transistor MP3. Changes in the voltage VB1 alter the impedance of MP3 resulting in a change in the common mode level of the IF output. The benefit is common mode stability. In prior art solutions, the common mode voltage control creates a large parasitic capacitor that makes the common mode control difficult to stabilize. But in accordance with the present invention, the common mode is fed back by transistor MP3, which can be a very small transistor, and due to this, it is easy to stabilize the common mode feedback loop.

In designing the present invention, the following facts to solve the problems of the mixers according to prior art have been taken into consideration:
(1) the current of an RF input terminal should be large for a good conversion gain;
(2) the current of an LO switching terminal should be low to lower the height of a pulse of flicker noise, but on the other hand, the current should be large to improve linearity;
(3) the size of an LO switch should be large enough to reduce MOS-inherent flicker noise;
(4) if the size of an LO-switch increases, parasitic capacitance will also increase; and
(5) if parasitic capacitance increases, flicker noise will also increase by an indirect mechanism.

When considering (1) and (2), a dynamic current bleeding circuitry is used to reduce the LO switching current only at the moment of commutation (the point where 1/f-noise is contributing) while for most of the LO-cycle time, the current is not decreased to keep an optimal linearity.

When considering (3)-(5), the parasitic capacitance degrades the switching speed and by this the 1/f-noise and the conversion gain. The dynamic bias structure MP1 and MP2 will pull up the source of the switches M3,M4 and M5,M6 only at the point of commutation to reduce the switching time and by this increase the conversion gain and decrease the 1/f-noise.

The mixer of the present invention can be used in a receiver such as a wireless receiver. The wireless receiver may be based on any suitable wireless protocol (e.g., Frequency Division Multiple Access (FDMA), Code Division Multiple Access (CDMA), Time Division Multiple Access (TDMA), Time Division Duplex (TDD), Orthogonal Frequency Multiple Access (OFDMA) or combinations of these such as CDMA/FDMA, CDMA/FDMA/TDMA, FDMA/TDMA). As a specific example, one of IEEE 802.11b, Bluetooth may be selected.

The features of a Bluetooth receiver may include one or more of:

Slow frequency hopping as a spread spectrum technique;
Master and slave units whereby the master unit can set the hopping sequence;
Each device has its own clock and its own address;
The hopping sequence of a master unit can be determined from its address;
A set of slave units communicating with one master all have the same hopping frequency (of the master) and form a piconet;
Piconets can be linked through common slave units to form a scatternet;
Time Division Multiple Access (TDMA) transmissions between slave and master units;
Time Division Duplex (TDD) transmissions between slaves and masters units;
Transmissions between slave and master units may be either synchronous or asynchronous;
Master units determine when slave units can transmit;
Slave units may only reply when addressed by a master unit;
The clocks are free-running;
Uncoordinated networks, especially those operating in the 2.4 GHz license-free ISM band;
A software stack to enable applications to find other Bluetooth™ devices in the area;
Other devices are found by a discovery/inquiry procedure; and
Hard or soft handovers.

With regard to frequency hopping, "slow frequency hopping" refers to the hopping frequency being slower than the modulation rate, "fast frequency hopping" referring to a hopping rate faster than the modulation rate. The present invention is not limited to either slow or fast hopping.

The present invention may be used with any suitable receiver topology (e.g., heterodyne receivers, low-IF receivers, zero-IF receivers). Low-IF and zero-IF receivers are preferred compared to heterodyne receivers as application of the present invention in the latter case may have a lower efficiency as it acts on 1/f-noise.

The heterodyne or IF receiver is the best known and most frequently used receiver topology. In the IF receiver, the wanted signal is down-converted to a relatively high intermediate frequency. A high quality passive bandpass filter is used to prevent a mirror signal from being folded upon the wanted signal on the IF frequency. The homodyne or zero-IF receiver has been introduced as an alternative for the IF receiver that can achieve a high degree of integration. The zero-IF receiver uses a direct, quadrature, down-conversion of the wanted signal to the baseband. The wanted signal has itself as mirror signal, and sufficient mirror signal suppression can, therefore, be achieved even with a limited quadrature accuracy. No discrete high frequency bandpass filter is required in the zero-IF receiver allowing in this way the realization of a fully integrated receiver, especially if the down-conversion is performed in a single stage (e.g., direct from 900 MHz to the baseband).

Figure 3:
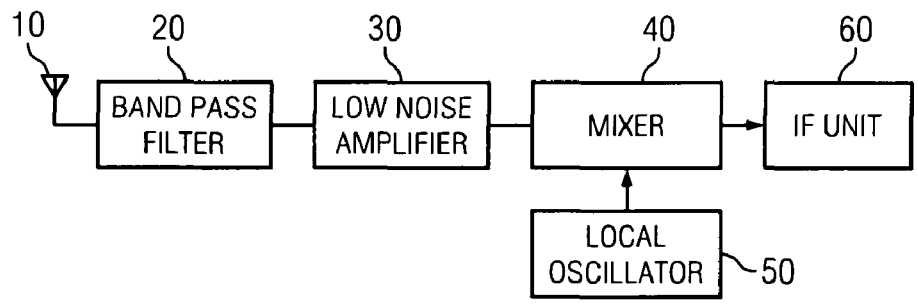
FIG. 3 illustrates the structure of a direct conversion receiver of a mobile communication system to which the present invention is applied.

A receiver that can be used with the mixer 40 of the present invention is shown schematically in FIG. 3. In this figure, an antenna 10 receives a radio signal. A Band Pass Filter (BPF) 20 (or when using in a zero IF receiver, a LPF (low pass filter)) performs band pass (alternatively low pass) filtering on a signal received by the antenna 10. A Low Noise Amplifier (LNA) 30 receives an RF signal that is band-pass filtered by the BPF 20 and performs low noise amplification on the received RF signal. A mixer 40 according to the present invention receives the RF signal that is low-noise amplified by the LNA 30 and mixes the RF signal with a LO signal applied from a Local Oscillator (LO) 50 to generate a frequency-converted IF signal to input to an IF unit 60. The mixer 40 shown in FIGS. 2 and 3 can be implemented as a CMOS mixer.

While the present invention has been shown and described with reference to preferred embodiments thereof, it will be understood by those skilled in the art that various changes in form and details may be made therein without departing from the spirit and scope of the invention.

What is claimed is:

1. A double balanced active mixer comprising:
a first input and a second input configured to input a Radio Frequency (RF) signal, wherein the first and second inputs are coupled to respective gates of a first input transistor and a second input transistor;
a third input and a fourth input configured to input a local oscillator signal;
a first output and a second output configured to output an Intermediate Frequency (IF) signal;
a plurality of switches configured to convert the RF signal to the IF signal;
a dynamic bleed circuit configured to dynamically reduce a dc-current of the plurality of switches at a switching-point of the plurality of switches;
a first load connected between a supply voltage and the first output;
a second load connected between the supply voltage and the second output; and
a common mode feedback circuit configured to feed a common mode signal to a common mode feedback control device that is in series between the dynamic bleed circuit and the supply voltage, and
wherein at least one of the gates of the first and the second input transistors is not coupled to the dynamic bleed circuit.

2. The mixer according to claim 1, wherein the dynamic bleed circuit is configured to reduce the dc current of the plurality of switches at twice the local oscillator frequency.

3. The mixer according to claim 2, wherein the plurality of switches comprises two differential switching transistor pairs.

4. The mixer according to claim 3, wherein a signal that is configured to switch the dynamic bleed circuit at twice the oscillator frequency is obtained at the source of the differential switching pairs.

5. The mixer according to claim 3, further comprising:
one or more voltage to current converting elements for receiving the RF signal, the RF signal current output of the one or more voltage to current converting elements configured to be supplied to the two differential switching transistor pairs, wherein the two differential switching transistor pairs form a multiplication function configured to multiply the RF signal current from the one or more voltage to current converting elements using the local oscillator signal applied across the gates of the two differential switching transistor pairs.

6. The mixer according to claim 1, further comprising:
a first transistor comprising a drain connected to the first output, a gate connected to the third input, and a source;
a second transistor comprising a drain connected to the second output, a gate connected to the fourth input, and a source;
a third transistor comprising a drain connected to the sources of the first transistor and the second transistor, a gate connected to the first input, and a source coupled to ground;
a fourth transistor comprising a drain connected to the first output, a gate connected to the fourth input, and a source;
a fifth transistor comprising a drain connected to the second output, a gate connected to the third input, and a source;
a sixth transistor comprising a drain connected to the sources of the fourth transistor and the fifth transistor, a gate connected to the second input, and a source coupled to ground;
a seventh transistor comprising a source or drain coupled to the supply voltage, a gate connected to a voltage source, and a drain or source connected to the drain of the third transistor; and
an eighth transistor comprising a source or drain coupled to the supply voltage, a gate connected to the voltage source, and a drain or source connected to the drain of the sixth transistor.

7. The mixer of claim 6, wherein the gate of the seventh transistor is coupled to the drain or source of the eighth transistor via a dc-decoupling element, and the gate of the eighth transistor is coupled to the drain or source of the seventh transistor via a dc-decoupling element.

8. The mixer according to claim 7, wherein the dc-decoupling element comprises at least one of a capacitor and a capacitor circuit.

9. The mixer according to claim 6, wherein the source or drain of the seventh transistor is coupled to the supply voltage via a common mode feedback control element and the source or drain of the eighth transistor is coupled to the supply voltage via the common mode feedback control element.

10. The mixer according to claim 9, wherein the common mode feedback control element comprises a ninth transistor, wherein a common mode signal is configured to be supplied to the gate of the ninth transistor.

11. The mixer according to claim 10, wherein any of the first to ninth transistors comprises a Field Effect Transistor (FET).

12. A wireless receiver comprising the double balanced active mixer according to claim 1.

13. The wireless receiver according to claim 12, wherein the receiver comprises at least one of a heterodyne receiver, a zero-IF receiver, and a low-IF receiver.

14. A double balanced active mixer comprising:
a first input and a second input configured to input a Radio Frequency (RF) signal;
a third input and a fourth input configured to input a local oscillator signal;
a first output and a second output configured to output an IF signal;
a plurality of switches configured to convert the RF signal to the IF signal;
a dynamic bleed circuit configured to dynamically reduce a dc-current of the plurality of switches at a switching-point of the plurality of switches;
a first transistor comprising a drain connected to the first output, a gate connected to the third input, and a source;
a second transistor comprising a drain connected to the second output, a gate connected to the fourth input, and a source;
a third transistor comprising a drain connected to the sources of the first transistor and the second transistor, a gate connected to the first input, and a source coupled to ground;
a fourth transistor comprising a drain connected to the first output, a gate connected to the fourth input, and a source;
a fifth transistor comprising a drain connected to the second output, a gate connected to the third input, and a source;
a sixth transistor comprising a drain connected to the sources of the fourth transistor and the fifth transistor, a gate connected to the second input, and a source coupled to ground;
a seventh transistor comprising a source or drain coupled to the supply voltage, a gate connected to a voltage source, and a drain or source connected to the drain of the third transistor; and
an eighth transistor comprising a source or drain coupled to the supply voltage, a gate connected to the voltage source, and a drain or source connected to the drain of the sixth transistor,
wherein the gate of the seventh transistor is coupled to the drain or source of the eighth transistor via a dc-decoupling element, and the gate of the eighth transistor is coupled to the drain or source of the seventh transistor via a dc-decoupling element.

15. The mixer according to claim 14, wherein the dc-decoupling element comprises at least one of a capacitor and a capacitor circuit.

16. The mixer according to claim 14, wherein the source or drain of the seventh transistor is coupled to the supply voltage via a common mode feedback control element and the source or drain of the eighth transistor is coupled to the supply voltage via the common mode feedback control element.

17. The mixer according to claim 14, wherein the common mode feedback control element comprises a ninth transistor, wherein a common mode signal is configured to be supplied to the gate of the ninth transistor.

18. The mixer according to claim 14, wherein any of the first to ninth transistors comprises a Field Effect Transistor (FET).

19. A wireless receiver comprising the double balanced active mixer according to claim 14.

20. The wireless receiver according to claim 19, wherein the receiver comprises at least one of a heterodyne receiver, a zero-IF receiver, and a low-IF receiver.

* * * * *